United States Patent
Luo (10) Patent No.: US 10,581,024 B2
(45) Date of Patent: Mar. 3, 2020

(54) DISPLAY COMPONENT PACKAGING STRUCTURE, MANUFACTURING METHOD THEREOF, AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/320,214

(22) PCT Filed: May 22, 2018

(86) PCT No.: PCT/CN2018/087863
§ 371 (c)(1),
(2) Date: Jan. 24, 2019

(87) PCT Pub. No.: WO2018/214878
PCT Pub. Date: Nov. 29, 2018

(65) Prior Publication Data
US 2019/0267566 A1    Aug. 29, 2019

(30) Foreign Application Priority Data

May 25, 2017    (CN) .......................... 2017 1 0379267

(51) Int. Cl.
| H01L 51/52 | (2006.01) |
| H01L 51/56 | (2006.01) |
| H01L 27/32 | (2006.01) |

(52) U.S. Cl.
CPC ........ *H01L 51/529* (2013.01); *H01L 27/3244* (2013.01); *H01L 51/524* (2013.01); *H01L 51/5243* (2013.01); *H01L 51/56* (2013.01)

(58) Field of Classification Search
None
See application file for complete search history.

(56) References Cited

U.S. PATENT DOCUMENTS 10,243,174 B2 * 3/2019 Li .......................... H01L 51/529
2007/0238214 A1   10/2007 Chou et al.
(Continued)

FOREIGN PATENT DOCUMENTS

| CN | 104037337 A | 9/2014 |
| CN | 104183785 A | 12/2014 |

(Continued)

OTHER PUBLICATIONS

First Office Action for Chinese Application No. 201710379267.X, dated May 29, 2018, 6 Pages.
(Continued)

*Primary Examiner* — Jack S Chen
(74) *Attorney, Agent, or Firm* — Brooks Kushman P.C.

(57) ABSTRACT

A display component packaging structure, a manufacturing method thereof, and a display device are provided. The display component packaging structure includes a base substrate, a display component arranged at a surface of the base substrate, a packaging cover plate covering the display component, and a heat dissipation layer arranged at a surface of the packaging cover plate adjacent to the display component. An orthogonal projection of the heat dissipation layer onto the base substrate at least partially overlaps an orthogonal projection of the display component onto the base substrate.

18 Claims, 2 Drawing Sheets

(56) References Cited

U.S. PATENT DOCUMENTS

| | | |
|---|---|---|
| 2016/0254485 A1 | 9/2016 | Song |
| 2016/0268523 A1 | 9/2016 | Kim et al. |
| 2017/0194595 A1 | 7/2017 | Li et al. |
| 2017/0194596 A1 | 7/2017 | Shen et al. |
| 2017/0279076 A1 | 9/2017 | Song |
| 2019/0267566 A1* | 8/2019 | Luo ................. H01L 51/529 |

FOREIGN PATENT DOCUMENTS

| | | |
|---|---|---|
| CN | 204011490 U | 12/2014 |
| CN | 104701353 A | 6/2015 |
| CN | 105470409 A | 4/2016 |
| CN | 105609660 A | 5/2016 |
| CN | 106601928 A | 4/2017 |
| CN | 107221607 A | 9/2017 |

OTHER PUBLICATIONS

Second Office Action for Chinese Application No. 201710379267.X, dated Nov. 26, 2018, 7 Pages.

International Search Report and Written Opinion for Application No. PCT/CN2018/087863, dated Aug. 21, 2018, 11 Pages.

* cited by examiner

DISPLAY COMPONENT PACKAGING STRUCTURE, MANUFACTURING METHOD THEREOF, AND DISPLAY DEVICE

CROSS-REFERENCE TO RELATED APPLICATIONS

This application is the U.S. national phase of PCT Application No. PCT/CN2018/087863 filed on May 22, 2018, which claims priority to Chinese Patent Application No. 201710379267.X filed on May 25, 2017, which are incorporated herein by reference in their entireties.

TECHNICAL FIELD

The present disclosure relates to the technical field of an electronic component, in particular to a display component packaging structure, a manufacturing method thereof, and a display device.

BACKGROUND

Currently, electroluminescent diode display components have attracted more and more attentions due to such advantages as low power consumption, high contrast and a wide viewing angle. In use, the electroluminescent diode display component is formed on a base substrate, and a packaging structure and a packaging cover plate are sequentially formed on a surface of the electroluminescent diode display component for packaging. However, during the packaging, when a packaging material having relatively low thermal conductivity is adopted, the heat dissipation for the electroluminescent diode display component may be adversely affected.

Conventional electroluminescent diode display components include Quantum Dot Light-Emitting Diode (QLED) display components and Organic Light-Emitting Diode (OLED) display components. Taking the OLED display component as an example, during the packaging, usually epoxy resin is selected as the packaging material. The epoxy resin has relatively low thermal conductivity, so heat may easily be accumulated in the OLED display component. At this time, a surface temperature of the OLED display component may increase with the elapse of time, and thereby a service life thereof may be adversely affected.

A commonly-adopted scheme in the related art includes providing a heat conducting plate outside the packaging cover plate, so as to enable the heat generated by the OLED display component in use to be distributed more evenly, thereby to facilitate the heat dissipation in a rapid manner. However, the heat conducting plate may easily fall off from the packaging cover plate. In addition, the packaging cover plate and a sealant are arranged between the heat conducting plate and the OLED display component, so a heat dissipation effect may be adversely affected.

In order to solve the above-mentioned drawback caused by the arrangement of the heat conducting plate outside the packaging cover plate, an uneven heat dissipation layer is formed in a thin film packaging structure between the OLED display component and the packaging cover plate for rapid heat dissipation. However, an organic layer is arranged between the heat dissipation layer and the OLED display component, the heat dissipation layer is covered by an inorganic layer, and an ultraviolet-curable or thermosetting packaging material is arranged between the inorganic layer and the packaging cover plate, so it is still impossible to achieve an excellent dissipation effect for the OLED display component. In a word, there is an urgent need to provide a scheme for improving the dissipation effect for the display component.

SUMMARY

In one aspect, the present disclosure provides in some embodiments a display component packaging structure, including: a base substrate; a display component arranged at a surface of the base substrate; a packaging cover plate covering the display component; and a heat dissipation layer arranged at a surface of the packaging cover plate adjacent to the display component. An orthogonal projection of the heat dissipation layer onto the base substrate at least partially overlaps an orthogonal projection of the display component onto the base substrate.

In some embodiments, the orthogonal projection of the heat dissipation layer onto the base substrate coincides with the orthogonal projection of the display component onto the base substrate.

In some embodiments, the heat dissipation layer includes a plurality of thermal conductive paste patterns separated from each other, and a pattern of a first sealant surrounding each of the plurality of thermal conductive paste patterns and configured to adhere the packaging cover plate to the display component.

In some embodiments, a pattern of a second sealant is further arranged at the surface of the packaging cover plate adjacent to the display component, an orthogonal projection of the pattern of the second sealant onto the base substrate surrounds an orthogonal projection of a display region of the display component onto the base substrate; and a filler is arranged at the surface of the packaging cover plate adjacent to the display component and between the pattern of the first sealant and the pattern of the second sealant.

In some embodiments, the second sealant has a viscosity greater than that of the first sealant, and the filler has a viscosity smaller than that of the first sealant.

In some embodiments, each thermal conductive paste pattern is of a cellular shape.

In some embodiments, the heat dissipation layer is arranged between, and in direct contact with, the packaging cover plate and the display component.

In some embodiments, the packaging cover plate is a metallic cover plate.

In some embodiments, a packaging thin film made of a heat dissipation material is arranged between the display component and the heat dissipation layer.

In some embodiments, the packaging thin film is arranged between, and in direct contact with, the display component and the heat dissipation layer, and the heat dissipation layer is arranged between, and in direct contact with, the packaging thin film and the packaging cover plate.

In another aspect, a display device includes the above display component packaging structure.

In yet another aspect, a method for manufacturing the display component packaging structure includes: forming a display component on a base substrate; forming a heat dissipation layer on a packaging cover plate; and laminating the base substrate onto the packaging cover plate in a press-fit manner. An orthogonal projection of the heat dissipation layer onto the base substrate at least partially overlaps an orthogonal projection of the display component onto the base substrate.

In some embodiments, the forming the heat dissipation layer on the packaging cover plate includes: forming a plurality of thermal conductive paste patterns made of a pasty thermal conductive paste material and separated from each other on the packaging cover plate; and forming a pattern of a first sealant surrounding each of the plurality of thermal conductive paste patterns, wherein a height of the pattern of the first sealant is greater than a height of the thermal conductive paste pattern.

In some embodiments, the forming the heat dissipation layer on the packaging cover plate includes: forming a pattern of a first sealant on the packaging cover plate; and forming a plurality of thermal conductive paste patterns by applying a solution of thermal conductive paste material within a region defined by the pattern of the first sealant, wherein a height of the pattern of the first sealant is greater than a height of the thermal conductive paste pattern.

In some embodiments, subsequent to forming the heat dissipation layer on the packaging cover plate and prior to laminating the base substrate onto the packaging cover plate in a press-fit manner, the method further includes: forming a pattern of a second sealant on the packaging cover plate, an orthogonal projection of the pattern of the second sealant onto the base substrate surrounding an orthogonal projection of a display region of the display component onto the base substrate; and applying a filler on the packaging cover plate and between the pattern of the first sealant and the pattern of the second sealant.

In some embodiments, subsequent to forming the display component on the base substrate and prior to laminating the base substrate onto the packaging cover plate in a press-fit manner, the method further includes: forming a packaging thin film by applying a heat dissipation material on a surface of the display component.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

The display component packaging structure, the method manufacturing the same and the display device provided in some embodiments of the present disclosure present disclosure will be described hereinafter in conjunction with the drawings and embodiments.

Figure 1:
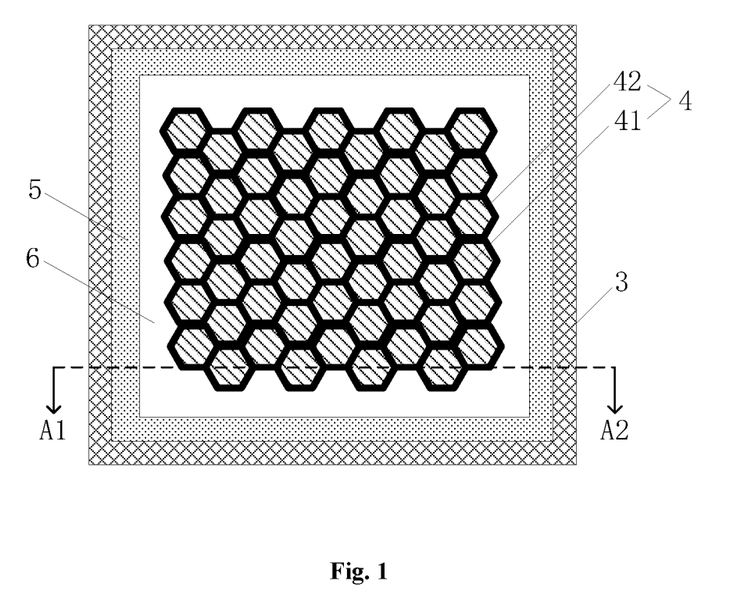
FIG. 1 is a top view of a packaging cover plate to be laminated according to some embodiments of the present disclosure.
Figure 4:
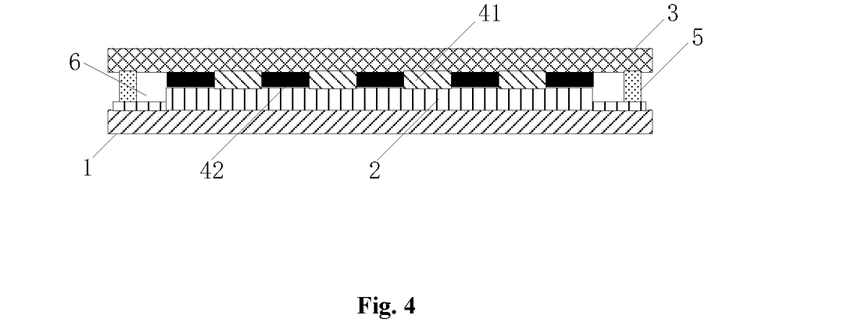
FIG. 4 is a schematic view showing a display component packaging structure according to some embodiments of the present disclosure.

As shown in FIGS. 1 and 4, the present disclosure provides in some embodiments a display component packaging structure which includes a base substrate 1, a display component arranged on a surface of the base substrate 1, a packaging cover plate 3 covering the display component 2, and a heat dissipation layer 4 arranged on a surface of the packaging cover plate adjacent to the display component 2. An orthogonal projection of the heat dissipation layer onto the base substrate 1 at least partially overlaps an orthogonal projection of the display component 2 onto the base substrate 1.

In actual use, the display component 2 may generate light and heat. Because the heat dissipation layer at least partially covers the display component 2, the heat generated by the display component 2 is capable of being transmitted to the heat dissipation layer 4, then to the packaging cover plate 3, and finally to the outside, so as to achieve the heat dissipation for the display component packaging structure. It should be appreciated that, when the orthogonal projection of the heat dissipation layer 4 onto the base substrate 1 at least partially overlaps the orthogonal projection of the display component 2 onto the base substrate 1, the orthogonal projection of the heat dissipation layer 4 onto the base substrate 1 may at least partially overlap an orthogonal projection of a display region of the display component 2 onto the base substrate 1. In addition, the heat dissipation layer 4 may be made of a material having a relatively large thermal conducting coefficient, so that the thermal conducting coefficient of the heat dissipation layer 4 is greater than a predetermined threshold, thereby to achieve a better heat dissipation effect. In a possible embodiment of the present disclosure, the predetermined threshold may be, but not limited to, 10 W/(m·k) at a temperature of 25° C. to 150° C.

According to the display component packaging structure in the embodiments of the present disclosure, the heat dissipation layer 4 is arranged on the packaging cover plate 3, and the thermal conducting coefficient of the heat dissipation layer 4 is greater than the predetermined threshold, so the heat dissipation layer 4 has very good thermal conducting performance. In addition, there is no blocking between the heat dissipation layer 4 and the packaging cover plate 3, and between the heat dissipation layer 4 and the display component 2, i.e., the heat dissipation layer 4 is in direct contact with the packaging cover plate 3 and the display component 2, so it is able to transfer the heat generated by the display component 2 rapidly and directly to the packaging cover plate 3 through the heat dissipation layer 4, thereby to achieve an excellent heat dissipation effect for the display component 2 and prolong a service life of the display component 2. In addition, the heat dissipation layer 4 is arranged between the packaging cover plate 3 and the display component 2, so it is able to prevent the heat dissipation layer 4 from easily falling off from the packaging cover plate 3 or the display component 2, thereby to ensure the heat dissipation performance and a service life of the display component packaging structure.

In a possible embodiment of the present disclosure, the orthogonal projection of the heat dissipation layer 4 onto the base substrate 1 may coincide with the orthogonal projection of the display component 2 onto the base substrate 1, i.e., the heat dissipation layer 4 is capable of covering the entire display region of the display component 2. In this way, the heat dissipation layer 4 and the display component 2 may contact to each other within a large area, it is able to release the heat generated by the display component 2 more rapidly and evenly, thereby to provide the display component packaging structure with better heat dissipation performance. It should be appreciated that, the orthogonal projection of the heat dissipation layer 4 onto the base substrate 1 may coincide with the orthogonal projection of the entire display component 2 (including the display region and a non-display region) onto the base substrate 1, so as to further improve the heat dissipation performance of the display component packaging structure.

The heat dissipation layer 4 may be of various structures. In order to enable the heat dissipation layer 4 to be in contact with the packaging cover plate 3 and the display component 2 in a better manner and prevent the heat dissipation layer 4 from easily falling off the display component 2 or the packaging cover plate 3, a specific structure of the heat dissipation layer 4 will be given as follows. Of course, the heat dissipation layer 4 may not be limited thereto.

Referring again to FIG. 1, the heat dissipation layer 4 may include a plurality of thermal conductive paste patterns 41 separated from each other, and a pattern 42 of a first sealant surrounding the thermal conductive paste patterns 41 and configured to adhere the packaging cover plate 3 to the display component 2. To be specific, the thermal conductive paste pattern 41 may be principally made of heat conducting silicone grease or organic silica gel with aluminium oxide or aluminium nitride as a filler. The thermal conductive paste pattern 41 may be of a circular, rectangular or cellular shape. In a possible embodiment of the present disclosure, the thermal conductive paste pattern 41 may be of a cellular shape, so as to provide a larger contact area between the thermal conductive paste pattern 41 and the display component 2, thereby to further improve the heat dissipation performance. A size of the thermal conductive paste pattern 41 may be set in accordance with the practical need. For example, when the thermal conductive paste pattern 41 has a circular shape, a diameter of the thermal conductive paste pattern 41 may be 5 mm to 10 mm.

In addition, the quantity of the thermal conductive paste patterns 41 and densities of the thermal conductive paste patterns at different regions may be set in accordance with the practical need. For example, the thermal conductive paste patterns having a larger density may be provided at a region of the packaging cover plate 3 corresponding to the display region of the display component 2, and the thermal conductive paste patterns having a smaller density may be provided at a region of the packaging cover plate 3 corresponding to the non-display region of the display component 2. In this way, it is able to reduce the manufacture cost while ensuring the heat dissipation performance of the display component packaging structure.

Referring to FIGS. 1 and 4, a pattern 5 of a second sealant may be further arranged at the surface of the packaging cover plate 3 adjacent to the display component 2, and an orthogonal projection of the pattern 5 of the second sealant onto the base substrate 1 may surround the orthogonal projection of the display region of the display component 2 onto the base substrate 1. A filler 6 may be arranged at the surface of the packaging cover plate 3 adjacent to the display component 2 and between the pattern 42 of the first sealant and the pattern 5 of the second sealant. Further, the pattern 5 of the second sealant may be arranged at the surface of the packaging cover plate 3 adjacent to the display component 2 and surround the heat dissipation layer 4. The orthogonal projection of the pattern 5 of the second sealant onto the base substrate 1 may surround the orthogonal projection of the display region of the display component 2 onto the base substrate 1, i.e., the orthogonal projection of the pattern 5 of the second sealant onto the base substrate 1 may be located at the non-display region of the display component 2. The pattern 5 of the second sealant may be configured to adhere the packaging cover plate 3 to the base substrate 1, so as to encapsulate the display component 2 in a better manner. In addition, in order to further improve a packaging effect and prevent moisture and oxygen from being in contact with the display component 2, the filler 6 may be arranged between the pattern 42 of the first sealant and the pattern 5 of the second sealant. An orthogonal projection of the filler 6 onto the base substrate 1 may be located within the display region or the non-display region of the display component 2, or both.

The first sealant, the second sealant and the filler 6 may each be UV-curable resin or thermosetting resin. In a possible embodiment of the present disclosure, they may each be a homopolymer or copolymer of monomers selected from the group consisting of epoxy resin, epoxypropyl acrylate, epoxypropyl methacrylate, methyl methacrylate, ethyl methacrylate, n-butyl methacrylate, methyl acrylate 6,7-heptylepoxide, and methacrylate 2-hydroxyethyl ester, or melamine formaldehyde resin, unsaturated polyester resin, organic silicon resin or furan resin.

In order to prevent the packaging cover plate 3 from being laminated unevenly and insufficiently to the base substrate 1, the second sealant may have a viscosity greater than that of the first sealant, and the filler 6 may have a viscosity smaller than that of the first sealant. In this way, it is able to ensure the adhesion between the packaging cover plate 3 and the base substrate 1, and prevent the occurrence of uneven and insufficient lamination caused when the first sealant, the second sealant and the filler 6 each have a relatively large viscosity. In a possible embodiment of the present disclosure, the first sealant may have a viscosity of 5000 mPa·s to 100000 mPa·s, the second sealant may have a viscosity of 100000 mPa·s to 400000 mPa·s, and the filler 6 may have a viscosity of 100 mPa·s to 2000 mPa·s.

The packaging cover plate 3 may be made of various materials. In a possible embodiment of the present disclosure, the packaging cover plate 3 may be a metallic cover plate made of copper, aluminium or iron, or an alloy thereof. The metallic cover plate has a relatively high heat conducting coefficient, so it is able to improve the heat dissipation performance of the display component packaging structure.

Figure 5:
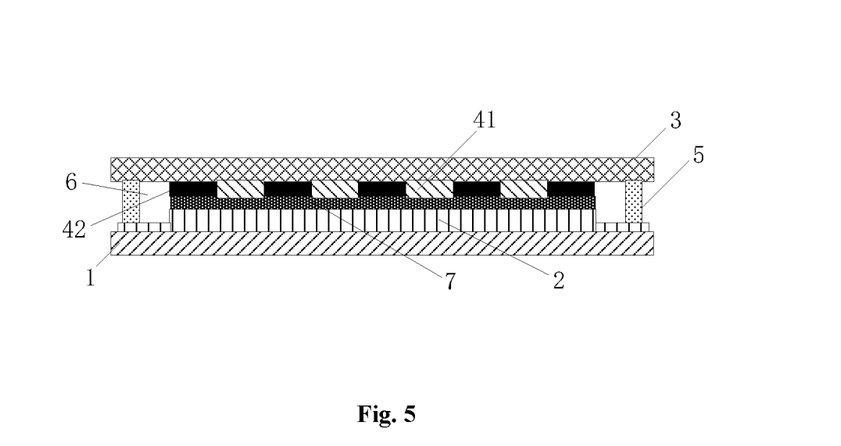
FIG. 5 is another schematic view showing the display component packaging structure according to some embodiments of the present disclosure.

Referring to FIG. 5, because the thermal conductive paste pattern 41 in the heat dissipation layer 4 is made of heat conducting silicone grease or organic silica gel, silica gel particles may exist in the thermal conductive paste pattern 41. When the silica gel particles are in direct contact with the display component 2, the display component 2 may easily be scratched. In order to prevent the display component 2 from being scratched, a packaging thin film 7 may be arranged between the display component 2 and the heat dissipation layer 4 in such a manner as to at least cover the display region of the display component 2. In order to prevent the heat dissipation performance of the display component packaging structure from being adversely affected by the packaging thin film 7, the packaging thin film 7 may be made of a heat dissipation material having a heat conducting coefficient greater than 10 W/(m·k). To be specific, the packaging thin film 7 may be made of $SiN_x$, SiCN, $SiO_2$, SiNO or $Al_2O_3$. It should be appreciated that, through the packaging thin film 7, it is able to ensure the heat dissipation performance of the display component packaging structure while preventing the silica gel particles in the heat dissipation layer 4 from scratching the display component 2. In addition, it is also able to prevent moisture and oxygen from being in contact with the display component 2, thereby to further improve the packaging effect.

The present disclosure further provides in some embodiments a display device including the above-mentioned display component packaging structure. The heat dissipation layer 4 having the heat conducting coefficient greater than the predetermined threshold is arranged on the packaging cover plate 3, and there is no blocking between the heat dissipation layer 4 and the packaging cover plate 3 as well as the display component 2. As a result, it is able to transfer the heat generated by the display component 2 to the packaging cover plate 3 rapidly and directly, thereby to achieve an excellent heat dissipation effect. Hence, it is able to provide the display device with an excellent heat dissipation effect and a long service life.

It should be appreciated that, the display device may be any product or member having a display function, e.g., television, display, digital photo frame, mobile phone or flat-panel computer. The display device may further include a flexible circuit board, a printed circuit board and a back plate.

Figure 2:
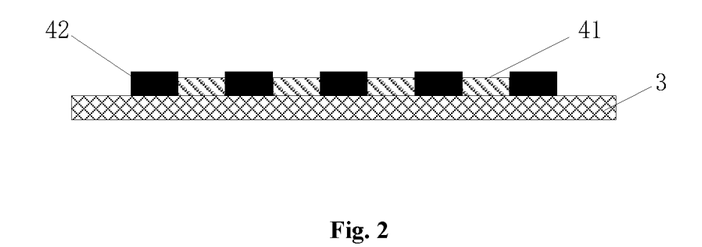
FIG. 2 is a schematic view showing the packaging cover plate with a heat dissipation layer according to some embodiments of the present disclosure.

The present disclosure further provides in some embodiments a method for manufacturing the above-mentioned display component packaging structure which includes: Step 101 of forming the display component 2 on the base substrate 1; Step 102 of forming the heat dissipation layer 4 on the packaging cover plate 3, as shown in FIG. 2; and Step 103 of laminating the base substrate 1 onto the packaging cover plate 3 in a press-fit manner, as shown in FIG. 4. An orthogonal projection of the heat dissipation layer 4 onto the base substrate 1 at least partially overlaps an orthogonal projection of the display component 2 onto the base substrate 1.

To be specific, in Step 101, the base substrate 1 may be made of glass, quartz or plastics. In Step 102, the heat dissipation layer 4 may be made of a material having a relatively large heat conducting coefficient so that the heat conducting coefficient of the heat dissipation layer 4 is greater than a predetermined threshold, so as to achieve a better heat dissipation effect. In a possible embodiment of the present disclosure, the predetermined threshold may be 10 W/(m·k) at a temperature of 25° C. to 150° C. In addition, the heat dissipation layer 4 may be formed through, but not limited to, coating or printing. In Step 103, the display component 2 may be arranged opposite to the heat dissipation layer 4 so that the orthogonal projection of the heat dissipation layer 4 onto the base substrate 1 at least partially overlaps the orthogonal projection of the display component 2 onto the base substrate 1, and then the base substrate 1 may be laminated onto the packaging cover plate 3 in a press-fit manner.

According to the method in the embodiments of the present disclosure, the heat dissipation layer 4 is arranged on the packaging cover plate 3, and the thermal conducting coefficient of the heat dissipation layer 4 is greater than the predetermined threshold, so the heat dissipation layer 4 has very good thermal conducting performance. After the base substrate 1 is laminated onto the packaging cover plate 3 in a press-fit manner, the orthogonal projection of the heat dissipation layer 4 onto the base substrate 1 at least partially overlaps the orthogonal projection of the display component 2 onto the base substrate 1, so that the heat dissipation layer 4 is capable of being in direct contact with the packaging cover plate 3 and the display component 2, i.e., there is no blocking between the heat dissipation layer 4 and the packaging cover plate 3 as well as the display component 2. As a result, it is able to transfer the heat generated by the display component 2 rapidly and directly to the packaging cover plate 3 through the heat dissipation layer 4, thereby to achieve a very good heat dissipation effect for the display component 2 and prolong a service life of the display component 2. Hence, through the method in the embodiments of the present disclosure, it is able to improve the heat dissipation performance of the display component packaging structure in a simple manner.

In addition, the heat dissipation layer 4 is arranged between the packaging cover plate 3 and the display component 2, so it is able to prevent the heat dissipation layer 4 from easily falling off from the packaging cover plate 3 or the display component 2, thereby to ensure the heat dissipation performance and a service life of the display component packaging structure.

In a possible embodiment of the present disclosure, in Step 102, an area of the heat dissipation layer 4 may be greater than or equal to an area of the orthogonal projection of the display region of the display component 2 onto the base substrate 1. As shown in FIG. 4, in Step 103, when the display component 2 is arranged opposite to the heat dissipation layer 4, the orthogonal projection of the heat dissipation layer 4 onto the base substrate 1 may coincide with the orthogonal projection of the display region of the display component 2 onto the base substrate 1, i.e., the heat dissipation layer 4 may cover the display region of the display component 2. In this way, it is able to provide a large contact area between the heat dissipation layer 4 and the display component 2, thereby to release the heat generated by the display component 2 more rapidly and improve the heat dissipation performance of the display component packaging structure.

In Step 102, the heat dissipation layer 4 having the heat conducting coefficient greater than the predetermined threshold may be formed on the packaging cover plate 3 in various ways, two of which will be described hereinafter.

In a first way, as shown in FIGS. 1 and 2, the forming the heat dissipation layer 4 on the packaging cover plate 3 may include: Step 1021' of forming the plurality of thermal conductive paste patterns 41 made of a pasty thermal conductive paste material and separated from each other on the packaging cover plate 3; and Step 1022' of forming the pattern 42 of the first sealant surrounding the thermal conductive paste patterns 41. A height of the pattern 42 of the first sealant may be greater than a height of each thermal conductive paste pattern 41.

To be specific, in Step 1021', the pasty thermal conductive paste material may be prepared at first. In a possible embodiment, an aluminium oxide powder and/or an aluminium nitride powder may be added into pasty heat conducting silicone grease or pasty organic silica gel, and then stirred so as to acquire the pasty thermal conductive paste material. Next, the pasty thermal conductive paste material may be coated or printed onto the packaging cover plate 3, so as to form the plurality of thermal conductive paste patterns 41 separated from each other. Each thermal conductive paste pattern 41 may have a height of 5 μm to 20 μm. In Step 1022', the first sealant may be coated onto the packaging cover plate in a marking-on manner, so as to form the pattern 42 of the first sealant surrounding each thermal conductive paste pattern 41.

In a second way, as shown in FIGS. 1 and 2, the forming the heat dissipation layer 4 on the packaging cover plate 3 may include: Step 1021" of forming the pattern 42 of the first sealant on the packaging cover plate 3; and Step 1022" of forming the plurality of thermal conductive paste patterns 42 by applying a solution of thermal conductive paste material within a region defined by the pattern 42 of the first sealant. A height of the pattern 42 of the first sealant may be greater than a height of each thermal conductive paste pattern 41.

To be specific, in Step 1021", the first sealant may be coated onto the packaging cover plate 3 in a marking-on manner, so as to form the pattern 42 of the first sealant. The pattern 42 of the first sealant may define a plurality of regions separated from each other. In Step 1022", the solution of thermal conductive paste material may be prepared at first, and then coated or printed onto the plurality of regions defined by the pattern 42 of the first sealant, so as to form the thermal conductive paste patterns 41 separated from each other.

In the above two ways, in order to ensure the adhesion between the packaging cover plate 3 and the display component 2, apart from surrounding each thermal conductive paste pattern 41, the pattern 42 of the first sealant may also be arranged at a region between the thermal conductive paste patterns 41, i.e., a gap between the thermal conductive paste patterns 41 in the heat dissipation layer 4 may also be filled up with the first sealant, so that no gap exists among the thermal conductive paste patterns 41. In addition, the height of each thermal conductive paste pattern 41 may be smaller than the height of the pattern 42 of the first sealant. In this way, through Steps 1021' and Step 1022", it is able to form the thermal conductive paste patterns 41 each of an irregular shape. Then, in Step 103, when the base substrate 1 is laminated onto the packaging cover plate 3, the pattern 42 of the first sealant may diffuse evenly, so as to press the irregular thermal conductive paste pattern 41 into a regular shape corresponding to the pattern 42 of the first sealant. In a possible embodiment of the present disclosure, the height of each thermal conductive paste pattern 41 may be $2/5$ to $4/5$, e.g., $1/2$, of the height of the pattern 42 of the first sealant.

Figure 3:
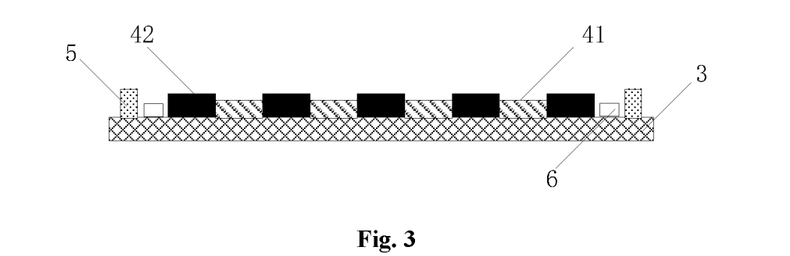
FIG. 3 is a sectional view of the packaging cover plate in FIG. 1 along line A1-A2.

After the formation of the heat dissipation layer 4 on the packaging cover plate 3 and before the lamination of the base substrate 1 onto the packaging cover plate 3, as shown in FIGS. 3 and 4, the method may further include forming the pattern 5 of the second sealant on the packaging cover plate 3, and providing the filler 6 between the pattern 42 of the first sealant and the pattern 5 of the second sealant. To be specific, the pattern 5 of the second sealant may be formed at a surface of the packaging cover plate 3 with the heat dissipation layer 4 in a marking-on manner, so as to surround the heat dissipation layer 4. An orthogonal projection of the pattern 5 of the second sealant onto the base substrate 1 may surround the orthogonal projection of the display region of the display component 2 onto the base substrate 1. Then, the filler 6 may be filled between the pattern 42 of the first sealant and the pattern 5 of the second sealant in a marking-on or dotting manner.

It should be appreciated that, the heights of the pattern 42 of the first sealant and the pattern 5 of the second sealant may be set in accordance with the practical need, as long as the packaging cover plate 3 may be firmly adhered to the display component 2 through the pattern 42 of the first sealant and the packaging cover plate 3 may be firmly adhered to the base substrate 1 through the pattern 5 of the second sealant. In a possible embodiment of the present disclosure, the height of the pattern 5 of the second sealant may be equal to the height of the pattern 42 of the first sealant. In addition, due to the deformation after the base substrate 1 has been laminated onto the packaging cover plate 3, the filler 6 may not be fully filled between the pattern 42 of the first sealant and the pattern 5 of the second sealant, i.e., a gap may be provided between the filler 6 and the pattern 42 of the first sealant and/or between the filler 6 and the pattern 5 of the second sealant (as shown in FIG. 3).

Subsequent to forming the display component 2 on the base substrate 1, as shown in FIG. 5, forming the packaging thin film 7 made of a heat dissipation material at a surface of the display component. To be specific, a $SiN_x$, SiCN, $SiO_2$, SiNO or $Al_2O_3$ material may be deposited onto the surface of the display component 2 through Chemical Vapor Deposition (CVD), Physical Vapor Deposition (PVD) or Atomic Layer Deposition (ALD), so as to at least cover the display region of the display component 2.

The method for manufacturing the display component packaging structure will be described hereinafter in more details.

In a possible embodiment of the present disclosure, the method for manufacturing the display component packaging structure may include the following steps.

Step 201: providing the base substrate 1 made of glass, and forming the display component 2 on the base substrate 1.

Step 202: providing the packaging cover plate 3 made of metal, forming the cellular pattern 42 of the first sealant having a side length of 5 mm and a height of 20 μm on the packaging cover plate 3 through coating, and evenly forming the thermal conductive paste patterns 41 having a height of 10 μm through coating within the regions defined by the pattern 42 of the first sealant. To be specific, sides of the cellular pattern 42 of the first sealant may be divided into three groups, and the first sealant may be coated in a dotting manner along every two parallel sides, so as to from three groups of segments which may be connected in an end-to-end manner to acquire the pattern 42 of the first sealant.

Step 203: forming the pattern 5 of the second sealant having a height of 20 μm on the packaging cover plate 3 through coating to surround the heat dissipation layer 4 and providing the filler 6 between the pattern 5 of the second sealant and the pattern 42 of the first sealant. The orthogonal projection of the pattern 5 of the second sealant onto the base substrate 1 may at least surround the display region of the display component 2.

Step 203: forming the packaging thin film 7 made of $SiN_x$ having the height of 1 μm through CVD.

Step 204: laminating the base substrate 1 onto the packaging cover plate 3, and curing the pattern 42 of the first sealant, the pattern 5 of the second sealant and the filler 6, so as to acquire the display component packaging structure. The orthogonal projection of the heat dissipation layer 4 onto the base substrate 1 may at least partially overlap the orthogonal projection of the display region of the display component 2 onto the base substrate 1, and the orthogonal projection of the pattern 5 of the second sealant onto the base substrate 1 may surround the display region of the display component 2.

In some other embodiments of the present disclosure, in Step 202, the plurality of thermal conductive paste patterns 41 each having a side length of 5 mm may be formed on the packaging cover plate 3 through printing, and then the pattern 42 of the first sealant may be formed in a dotting manner so as to surround each thermal conductive paste pattern 41.

Features, structures or materials may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display component packaging structure, comprising:
a base substrate;
a display component arranged at a surface of the base substrate;
a packaging cover plate covering the display component; and
a heat dissipation layer arranged at a surface of the packaging cover plate adjacent to the display component,
wherein an orthogonal projection of the heat dissipation layer onto the base substrate at least partially overlaps an orthogonal projection of the display component onto the base substrate,
wherein the heat dissipation layer includes a plurality of thermal conductive paste patterns separated from each other, and a pattern of a first sealant surrounding each of the plurality of thermal conductive paste patterns and configured to adhere the packaging cover plate to the display component.

2. The display component packaging structure according to claim 1, wherein the orthogonal projection of the heat dissipation layer onto the base substrate coincides with the orthogonal projection of the display component onto the base substrate.

3. The display component packaging structure according to claim 2, wherein the heat dissipation layer is arranged between, and in direct contact with, the packaging cover plate and the display component.

4. The display component packaging structure according to claim 2, wherein the packaging cover plate is a metallic cover plate.

5. The display component packaging structure according to claim 1, wherein
a pattern of a second sealant is further arranged at the surface of the packaging cover plate adjacent to the display component, an orthogonal projection of the pattern of the second sealant onto the base substrate surrounds an orthogonal projection of a display region of the display component onto the base substrate; and
a filler is arranged at the surface of the packaging cover plate adjacent to the display component and between the pattern of the first sealant and the pattern of the second sealant.

6. The display component packaging structure according to claim 5, wherein the second sealant has a viscosity greater than that of the first sealant, and the filler has a viscosity smaller than that of the first sealant.

7. The display component packaging structure according to claim 1, wherein each thermal conductive paste pattern is of a cellular shape.

8. The display component packaging structure according to claim 1, wherein the heat dissipation layer is arranged between, and in direct contact with, the packaging cover plate and the display component.

9. The display component packaging structure according to claim 1, wherein the packaging cover plate is a metallic cover plate.

10. The display component packaging structure according to claim 1, wherein a packaging thin film made of a heat dissipation material is arranged between the display component and the heat dissipation layer.

11. The display component packaging structure according to claim 10, wherein the packaging thin film is arranged between, and in direct contact with, the display component and the heat dissipation layer, and the heat dissipation layer is arranged between, and in direct contact with, the packaging thin film and the packaging cover plate.

12. A display device, comprising the display component packaging structure according to claim 1.

13. A method for manufacturing the display component packaging structure according to claim 1, comprising:
forming a display component on a base substrate;
forming a heat dissipation layer on a packaging cover plate; and
laminating the base substrate onto the packaging cover plate in a press-fit manner,
wherein an orthogonal projection of the heat dissipation layer onto the base substrate at least partially overlaps an orthogonal projection of the display component onto the base substrate.

14. The method according to claim 13, wherein the forming the heat dissipation layer on the packaging cover plate includes:
forming a plurality of thermal conductive paste patterns made of a pasty thermal conductive paste material and separated from each other on the packaging cover plate; and
forming a pattern of a first sealant surrounding each of the plurality of thermal conductive paste patterns, wherein a height of the pattern of the first sealant is greater than a height of the thermal conductive paste pattern.

15. The method according to claim 14, wherein subsequent to forming the heat dissipation layer on the packaging cover plate and prior to laminating the base substrate onto the packaging cover plate in a press-fit manner, the method further includes:
forming a pattern of a second sealant on the packaging cover plate, an orthogonal projection of the pattern of the second sealant onto the base substrate surrounding an orthogonal projection of a display region of the display component onto the base substrate; and
applying a filler on the packaging cover plate and between the pattern of the first sealant and the pattern of the second sealant.

16. The method according to claim 13, wherein the forming the heat dissipation layer on the packaging cover plate includes:
forming a pattern of a first sealant on the packaging cover plate; and
forming a plurality of thermal conductive paste patterns by applying a solution of thermal conductive paste material within a region defined by the pattern of the first sealant, wherein a height of the pattern of the first sealant is greater than a height of the thermal conductive paste pattern.

17. The method according to claim 16, wherein subsequent to forming the heat dissipation layer on the packaging cover plate and prior to laminating the base substrate onto the packaging cover plate in a press-fit manner, the method further includes:
forming a pattern of a second sealant on the packaging cover plate, an orthogonal projection of the pattern of the second sealant onto the base substrate surrounding an orthogonal projection of a display region of the display component onto the base substrate; and
applying a filler on the packaging cover plate and between the pattern of the first sealant and the pattern of the second sealant.

18. The method according to claim 13, wherein subsequent to forming the display component on the base substrate and prior to laminating the base substrate onto the packaging cover plate in a press-fit manner, the method further includes:

forming a packaging thin film by applying a heat dissipation material on a surface of the display component.

* * * * *